(12) United States Patent
Harvey et al.

(10) Patent No.: US 8,999,737 B2
(45) Date of Patent: Apr. 7, 2015

(54) METHOD OF MAKING MOLDED LED PACKAGE

(71) Applicant: Glo AB, Lund (SE)

(72) Inventors: Douglas Harvey, Sunnyvale, CA (US); Ronald Kaneshiro, Los Altos, CA (US)

(73) Assignee: Glo AB, Lund (SE)

( * ) Notice: Subject to any disclaimer, the term of this patent is extended or adjusted under 35 U.S.C. 154(b) by 0 days.

(21) Appl. No.: 14/031,751

(22) Filed: Sep. 19, 2013

(65) Prior Publication Data

US 2015/0064815 A1 Mar. 5, 2015

Related U.S. Application Data

(60) Provisional application No. 61/870,312, filed on Aug. 27, 2013.

(51) Int. Cl.
*H01L 33/00* (2010.01)
*H01L 21/66* (2006.01)
*H01L 33/62* (2010.01)

(52) U.S. Cl.
CPC ............... *H01L 33/62* (2013.01); *H01L 22/14* (2013.01)

(58) Field of Classification Search
USPC .................. 438/33, 68, 113, 114, 459–465
See application file for complete search history.

(56) References Cited

U.S. PATENT DOCUMENTS

| | | | |
|---|---|---|---|
| 6,184,544 B1 | 2/2001 | Toda et al. | |
| 6,335,545 B1 | 1/2002 | Toda et al. | |
| 7,318,651 B2 | 1/2008 | Chua et al. | |
| 7,335,908 B2 | 2/2008 | Samuelson et al. | |
| 7,396,696 B2 | 7/2008 | Kim et al. | |
| 7,471,040 B2 | 12/2008 | Nishimura | |
| 7,829,443 B2 | 11/2010 | Seifert et al. | |
| 8,304,268 B2 * | 11/2012 | Lin et al. | 438/33 |
| 8,420,414 B2 * | 4/2013 | Horiuchi et al. | 438/26 |
| 8,519,611 B2 | 8/2013 | Radkov et al. | |

(Continued)

FOREIGN PATENT DOCUMENTS

| | | |
|---|---|---|
| CN | 102427075 B | 8/2013 |
| EP | 1837386 A1 | 9/2007 |

(Continued)

OTHER PUBLICATIONS

U.S. Appl. No. 14/031,829, Douglas Harvey et al., "Molded LED Package," filed Sep. 19, 2013, Specification and drawings.

(Continued)

*Primary Examiner* — Savitr Mulpuri
(74) *Attorney, Agent, or Firm* — The Marbury Law Group PLLC

(57) ABSTRACT

Methods of packaging a light emitting diode (LED) include providing a first lead having a first recess in a bottom surface and a second lead having a second recess in a bottom surface, placing a LED die over a top surface of at least one of the first and the second leads, electrically connecting the LED die to the first lead and to the second lead, forming a package around the LED die that includes an opening in its upper surface exposing at least the LED die, and separating the package containing the LED die, the first lead and the second lead from a lead frame such that the package contains a first castellation and a second castellation in a side surface of the package, such that the castellations expose the leads and/or a first platable metal which is electrically connected to the leads.

10 Claims, 7 Drawing Sheets

(56) References Cited

U.S. PATENT DOCUMENTS

| | | |
|---|---|---|
| 8,530,250 B2 | 9/2013 | Ichikawa et al. |
| 8,556,488 B2 | 10/2013 | Lee |
| 2002/0028525 A1 | 3/2002 | Sakamoto et al. |
| 2004/0159850 A1 | 8/2004 | Takenaka |
| 2005/0151149 A1* | 7/2005 | Chia et al. ................ 257/99 |
| 2007/0126011 A1 | 6/2007 | Lee |
| 2007/0138697 A1 | 6/2007 | Takeda et al. |
| 2007/0247841 A1 | 10/2007 | Kono et al. |
| 2008/0012036 A1 | 1/2008 | Loh et al. |
| 2008/0316741 A1 | 12/2008 | Lee |
| 2009/0194782 A1 | 8/2009 | Hata et al. |
| 2009/0207111 A1 | 8/2009 | Wang et al. |
| 2009/0243504 A1 | 10/2009 | Cho et al. |
| 2010/0140638 A1 | 6/2010 | Kotani et al. |
| 2010/0270571 A1 | 10/2010 | Seo |
| 2011/0220920 A1 | 9/2011 | Collins et al. |
| 2011/0309382 A1 | 12/2011 | Lowgren |
| 2012/0104445 A1* | 5/2012 | Yang et al. ................ 257/98 |
| 2012/0273826 A1 | 11/2012 | Yamamoto et al. |
| 2012/0281154 A1 | 11/2012 | Yokoyama |
| 2013/0017631 A1* | 1/2013 | Takeda et al. ............. 438/26 |
| 2013/0153952 A1 | 6/2013 | Yamashita et al. |
| 2014/0061697 A1* | 3/2014 | Lin et al. ................ 257/98 |

FOREIGN PATENT DOCUMENTS

| | | |
|---|---|---|
| JP | 11-087780 | 3/1999 |
| JP | 11-214754 A | 8/1999 |
| JP | 2000-174347 | 6/2000 |
| JP | 2001-036154 | 2/2001 |
| JP | 2002217454 A | 8/2002 |
| JP | 2006-140207 | 6/2006 |
| JP | 2006-313943 A | 11/2006 |
| JP | 2007-035794 | 2/2007 |
| JP | 2007-123302 | 5/2007 |
| JP | 2007-235085 | 9/2007 |
| JP | 2008-106226 | 5/2008 |
| JP | 2010092705 A | 4/2010 |
| JP | 2010197840 A | 9/2010 |
| JP | 2010232529 A | 10/2010 |
| JP | 2011159832 A | 8/2011 |
| JP | 2011243963 A | 12/2011 |
| JP | 2012234955 A | 11/2012 |
| KR | 20070077574 A | 7/2007 |
| KR | 20090055402 A | 6/2009 |
| KR | 20090057755 A | 6/2009 |
| KR | 20090108171 A | 10/2009 |
| WO | WO2006/126438 A1 | 11/2006 |
| WO | WO2007/037662 | 4/2007 |
| WO | WO2007102781 A1 | 9/2007 |
| WO | WO2007/135707 A1 | 11/2007 |
| WO | WO2008048704 A3 | 4/2008 |
| WO | WO2008/051397 | 5/2008 |
| WO | WO2008/059856 A1 | 5/2008 |
| WO | WO2009/002911 | 12/2008 |
| WO | WO2010014032 A1 | 2/2010 |
| WO | WO2011162715 A1 | 12/2011 |
| WO | 2012029912 A1 | 3/2012 |
| WO | WO2013/021941 | 2/2013 |

OTHER PUBLICATIONS

U.S. Appl. No. 14/031,829, Office Action, issued Jul. 9, 2014.
International Search Report and Written Opinion received in connection with international application No. PCT/US2014/052232; dated Dec. 1, 2014.

* cited by examiner

METHOD OF MAKING MOLDED LED PACKAGE

FIELD

The embodiments of the invention are directed generally to packaged light emitting diode (LED) devices and methods of packaging LED devices.

BACKGROUND

Light emitting diodes (LEDs), such as nanowire LEDs, have a variety of uses, including in electronic displays, such as liquid crystal displays in laptops or LED televisions. In a typical LED packaging process, a semiconductor die containing one or more LEDs is mounted to a lead frame, and the die and lead frame are encased in a protective mold. The mold may include an open region aligned with the LED that enables light to be emitted from the LED. Electrical connections to the LED package may be made via the lead frame. Further improvements in LED packaging would be desirable.

SUMMARY

Various embodiments include methods of packaging a light emitting diode (LED) that include providing a lead frame comprising a first lead having a first recess in a bottom surface and a second lead having a second recess in a bottom surface, placing a LED die over a top surface of at least one of the first and the second leads, electrically connecting the LED die to the first lead and to the second lead, forming a package around the LED die, the first lead and the second lead, the package having an opening in its upper surface exposing at least the LED die, and separating the package containing the LED die, the first lead and the second lead from the lead frame such that the package contains a first castellation and a second castellation in a side surface of the package, wherein the first castellation exposes at least one of the first lead and a first platable metal which is electrically connected to the first lead, the second castellation exposes at least one of the second lead and a second platable metal which is electrically connected to the second lead.

Further embodiments include methods of packaging a light emitting diode (LED) that include providing a lead frame comprising a first lead and a second lead, placing a LED die over a top surface of at least one of the first and the second leads, electrically connecting the LED die to the first lead and to the second lead, forming a package around the LED die, the first lead and the second lead, the package having an opening in its upper surface exposing at least the LED die, and separating the package containing the LED die, the first lead and the second lead from the lead frame, wherein the lead frame contains a first alignment mark and the package contains a second alignment mark.

Further embodiments include methods of packaging light emitting diodes (LEDs) that include bonding a plurality of LED die over a plurality of leads of a lead frame, electrically connecting each of the plurality of LED die to a respective two of the plurality of leads, dipping the lead frame into a mold containing a moldable material, solidifying the moldable material to form a panel comprising a plurality of moldable material packages attached to the lead frame, wherein each of the plurality of packages is located around at least one of the plurality of LED dies electrically connected to the respective two of the plurality of leads, attaching a first set of the plurality of packages to a dicing tape, and singulating the first set of the plurality of packages from the panel.

Further embodiments include methods of testing a packaged light emitting diode (LED) that include providing a package containing a LED die which is electrically connected to a first lead and to a second lead located in the package, wherein the LED die is located over a top surface of at least one of the first and the second leads, attaching a bottom surface of the package to dicing tape such that a first recess is located in a bottom surface of the first lead exposed in the bottom surface of the package and a second recess is located in a bottom surface of the second lead exposed in the bottom surface of the package, and testing the LED die by poking a testing pin or needle through the dicing tape into at least one of the first recess and the second recess.

BRIEF DESCRIPTION OF THE DRAWINGS

The accompanying drawings, which are incorporated herein and constitute part of this specification, illustrate example embodiments of the invention, and together with the general description given above and the detailed description given below, serve to explain the features of the invention.

DETAILED DESCRIPTION

The various embodiments will be described with reference to the accompanying drawings. Wherever possible, the same reference numbers will be used throughout the drawings to refer to the same or like parts. References made to particular examples and implementations are for illustrative purposes, and are not intended to limit the scope of the invention or the claims.

Embodiments of the invention include packaged LED devices and methods of packaging an LED. In various embodiments, a package and lead design includes features that enable the packaged LED device to be mounted as either a top-emitting or a side-emitting LED package.

Figure 1:
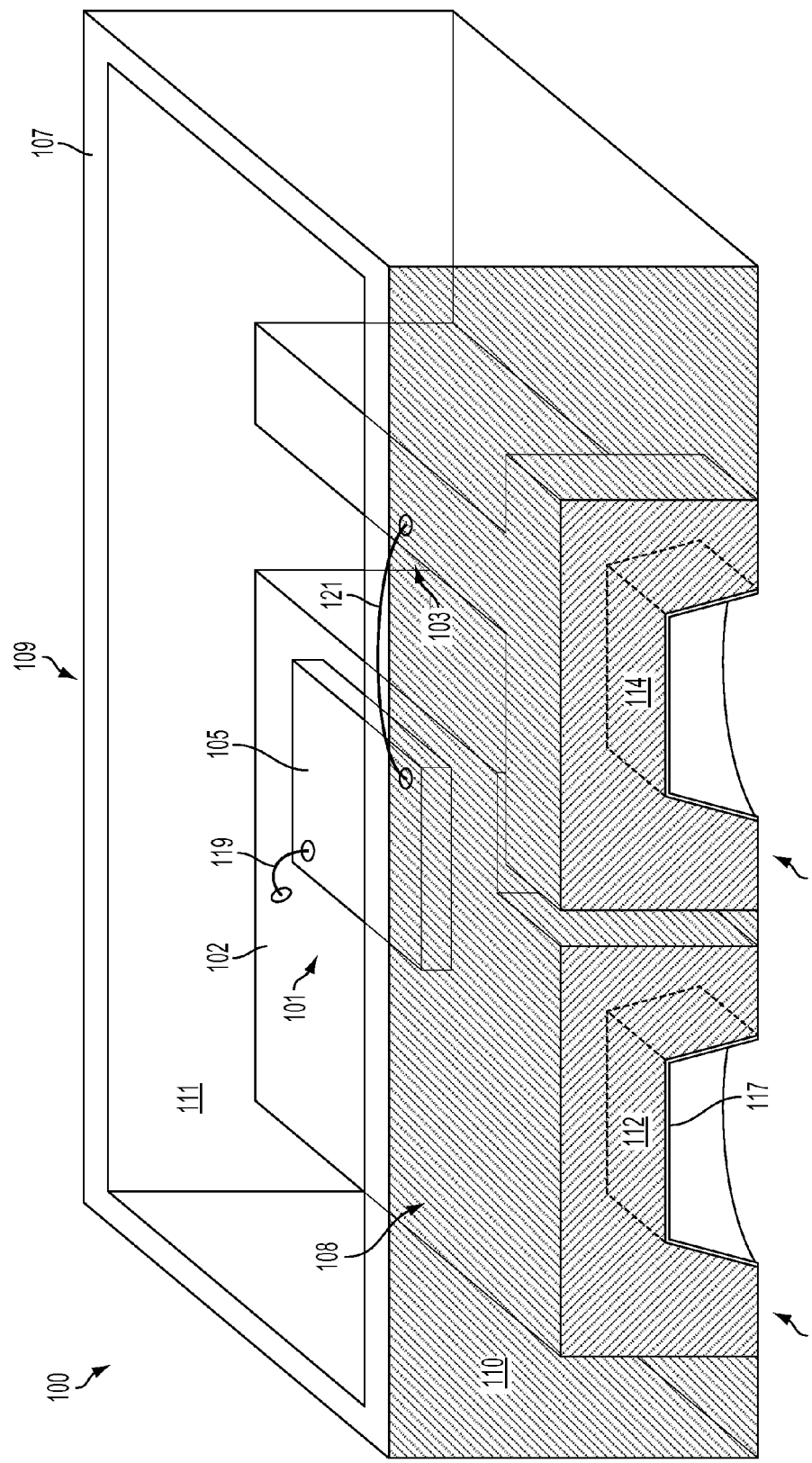
FIG. 1 is a schematic perspective illustration of a packaged LED device according to an embodiment.

FIG. 1 is a schematic perspective illustration of a packaged LED device 100 according to one embodiment. The packaged LED device 100 includes a plurality of leads, including a first lead 101 and a second lead 103. Each lead 101, 103 may be formed of an electrically conductive material (e.g., a metal, such as copper). The leads 101, 103 may be formed as part of a lead frame and separated from the frame to produce individual packaged LED devices 100, as described below. The leads 101, 103 may extend generally parallel without contacting one another between a first side surface 108 and a second side surface 109 of the device 100.

At least one LED die 105 (e.g., chip) may be mounted on a first surface 102 of lead 101. The LED die 105 may include one or more light-emitting semiconductor elements on a supporting substrate. Any suitable LED structure may be utilized. In embodiments, the LED may be a nanowire-based LED. Nanowire LEDs are typically based on one or more pn- or pin-junctions. Each nanowire may comprise a first conductivity type (e.g., doped n-type) nanowire core and an enclosing second conductivity type (e.g., doped p-type) shell for forming a pn or pin junction that in operation provides an active region for light generation. An intermediate active region between the core and shell may comprise a single intrinsic or lightly doped (e.g., doping level below $10^{16}$ cm$^{-3}$) semiconductor layer or one or more quantum wells, such as 3-10 quantum wells comprising a plurality of semiconductor layers of different band gaps. Nanowires are typically arranged in arrays comprising hundreds, thousands, tens of thousands, or more, of nanowires side by side on the supporting substrate to form the LED structure. The nanowires may comprise a variety of semiconductor materials, such as III-V semiconductors and/or III-nitride semiconductors, and suitable materials include, without limitation GaAs, InAs, Ge, ZnO, InN, GaInN, GaN, AlGaInN, BN, InP, InAsP, GaInP, InGaP:Si, InGaP:Zn, GaInAs, AlInP, GaAlInP, GaAlInAsP, GaInSb, InSb, AlN, GaP and Si. The supporting substrate may include, without limitation, III-V or II-VI semiconductors, Si, Ge, $Al_3O_3$, SiC, Quartz and glass. Further details regarding nanowire LEDs and methods of fabrication are discussed, for example, in U.S. Pat. Nos. 7,396,696, 7,335,908 and 7,829,443, PCT Publication Nos. WO2010014032, WO2008048704 and WO2007102781, and in Swedish patent application SE 1050700-2, all of which are incorporated by reference in their entirety herein. Alternatively, bulk (i.e., planar layer type) LEDs may be used instead of or in addition to the nanowire LEDs.

The LED die 105 may be mounted to the first surface 102 of the lead 101 using any suitable bonding technique. In embodiments, the surface of the LED die 105 may be electrically insulated from the lead 101 via an insulating material (e.g., a sapphire layer), which may be or may form part of the support substrate of the die 105. The active region of the LED die 105 may be electrically connected to the first lead 101 by a first wire 119, which may be bonded to a first bond pad region of the die 105. A second wire 121 may be bonded to a second bond pad region of the die 105 to electrically connect the die 105 to the second lead 103.

The packaged LED device 100 also includes a package 107, which may be a protective mold around the die 105 and leads 101, 103. For clarity, the package 107 is shown as transparent in FIG. 1. In embodiments, the package 107 may be a molded epoxy material, although other materials (e.g., ceramic, plastic, glass, etc.) may be utilized. The leads 101, 103 may be at least partially embedded in the package 107. As shown in FIG. 1, the package 107 may form the sidewalls and at least a portion of the bottom surface of the device 100 and may include an opening 111 in its upper surface exposing at least the LED die 105. In some embodiments, the opening 111 may be filled with an encapsulant material (not shown) that is optically transmissive over at least a selected wavelength range. The encapsulant may comprise a phosphor or dye material.

The leads 101, 103 may each include a recessed portion 112, 114 on a bottom surface of the respective leads 101, 103 (i.e., on the surface opposite the LED die 105). The package 107 may include a first castellation 113 and a second castellation 115 in a side surface 110 of the package 107. The first castellation 113 exposes an edge of the first lead 101 including the recessed portion 112. The second castellation 115 exposes an edge of the second lead 103 including the recessed portion 114. Each of the recessed portions 112, 114 may include a filler material 117, which may be a platable metal formed over the recessed portions 112, 114. Thus, in an embodiment, the first castellation 113 exposes an edge of the first lead 101 and platable metal 117, and the second castellation 115 exposes an edge of the second lead 103 and the platable metal 117.

In the embodiment of FIG. 1, the leads 101, 103 have non-uniform dimensions along their length between the first end 108 and the second end 109 of the device 100. As shown in FIG. 1, the cross-sectional dimensions of the leads 101, 103 are identical proximate the first end 108, including in the portions containing the respective recessed portions 112, 114, but are different proximate to the second end 108 of the device. The first lead 101 has an "L" shape in which the width of the lead 101 increases to accommodate the LED die 105. The second lead 103 is widest proximate to the first end 108, and narrows proximate to the second end 109. Various other configurations are possible, including where the leads 101, 103 have identical shapes along their entire lengths. Preferably, the LED die 105 is bonded to only to the top surface 102 of a rear portion of the first lead 101, the first recess 112 is located in the bottom surface in a front portion of the first lead 101 which is different from the rear portion of the first lead, and the second recess 114 is located in the bottom surface in a front portion of the second lead 103 which is wider than rear portion of the second lead.

Figure 2A:
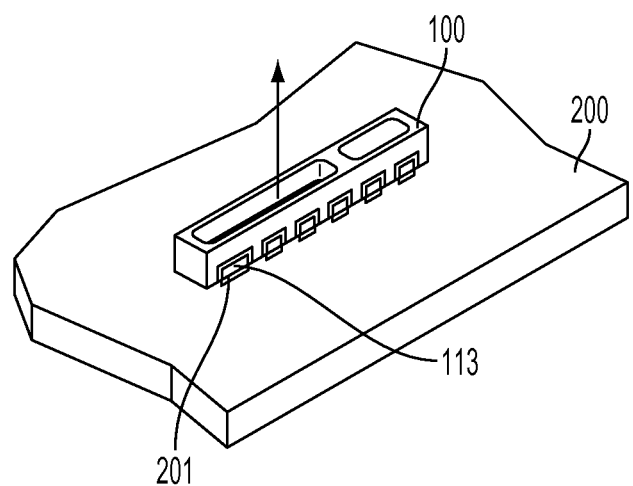
FIG. 2A illustrates the packaged LED device mounted in a top-emitting configuration.
Figure 2B:
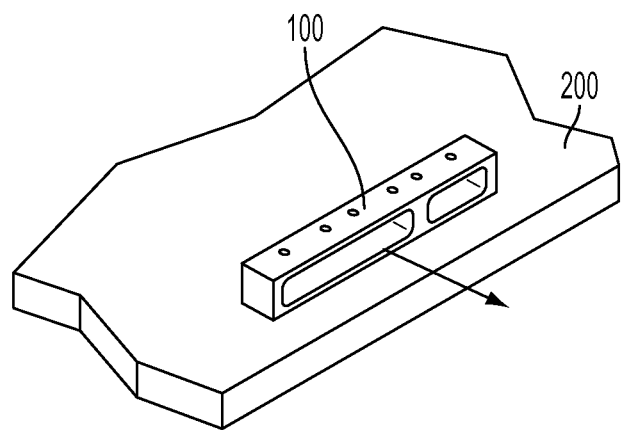
FIG. 2B illustrates the packaged LED device mounted in a side-emitting configuration.

The packaged LED device 100 may be mounted to a support surface 200 in either a top-emitting or a side-emitting configuration, as shown in FIGS. 2A-B. FIG. 2A shows the device 100 in a top-emitting configuration, with the predominant direction of light emission from the LED indicated by the vertical arrow. At least a portion of the leads 101, 103, including at least the recessed portions 112, 114, may be exposed on the bottom surface of the package 107. Electrical contacts 201 located over the support surface 200 may contact the exposed portions of the respective leads 101, 103 to connect the leads 101, 103 and the LED die 105 to an external current/voltage source. In embodiments, the electrical contacts 201 may be bonded to the leads 101, 103, such as via soldering. In some embodiments, the electrical contacts 201 may be soldered to the optional filler material 117 that may be located within the recessed portions 112, 114 of the leads 101, 103.

FIG. 2B shows the device 100 in a side-emitting configuration, in which the side surface 110 of the package 107 containing the castellations 113, 115 (see FIG. 1) faces the support structure 200 and the predominant direction of light emission (as indicated by the arrow) is parallel to the support surface 200. In this configuration, the electrical contacts 201 on the support structure 200 (not visible in this view) contact the first and second leads 101, 103 through the first and second castellations 113, 115, respectively. As in the embodiment of FIG. 2A, the electrical contacts 201 may be bonded (e.g., soldered) to the leads, either directly or indirectly through the optional filler material. The side-emitting configuration of FIG. 2B may provide improved coupling of light into a waveguide.

Figure 3A:
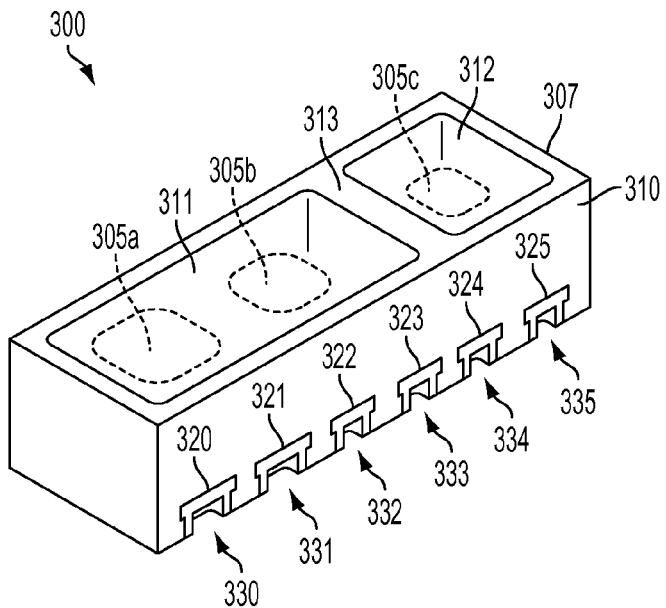
FIG. 3A illustrates a packaged LED device according to one embodiment in which the package includes multiple LED dies and an interior wall separating a first compartment containing the at least one first LED die from a second compartment containing at least one second LED die.

The embodiment of FIG. 1 illustrates a package for a single LED die. In other embodiments, multiple LED dies may be included within a package. FIG. 3A illustrates an embodiment of a packaged LED device 300 in which the package 307 includes multiple LED dies 305a, 305b, 305c and an interior wall 313 separating a first compartment 311 containing LED dies 305a, 305b from a second compartment 312 containing LED die 305c. Each of the LED dies 305a, 305b, 305c may be configured to emit light at different wavelengths (e.g., green, blue and red visible light). The packaged LED device 300 may include a plurality of leads 320, 321, 322, 323, 324, 325, each having a recessed portion as described above in connection with FIG. 1. Each of the dies 305a, 305b, 305c may be mounted on a top surface of a lead and electrically connected to at least two different leads, as described above. The package 307 may include castellations 330, 331, 332, 333, 334, 335, 336 on a side surface 310 of the package 307 that expose the edges of the leads 320, 321, 322, 323, 324, 325 at their respective recessed portions.

In one embodiment, the interior wall 313 may separate the second compartment 312 containing a red-emitting LED die 305c from the first compartment 311 containing a green-emitting LED die 305a and a blue-emitting LED die 305b. The second compartment 312 may contain a first encapsulant (not shown) containing a red emitting phosphor located over the red LED die 305c, and the first compartment 311 may contain a second encapsulant (not shown) which lacks the red emitting phosphor located over the green-emitting LED die 305a and the blue-emitting LED die 305b. Each die may contain nanowire and/or bulk LEDs. For example, the green emitting die 305a may comprise nanowire LEDs, the red emitting die 305c may comprise bulk LEDs, and the blue emitting die 305b may comprise either nanowire or bulk LEDs.

Figure 3B:
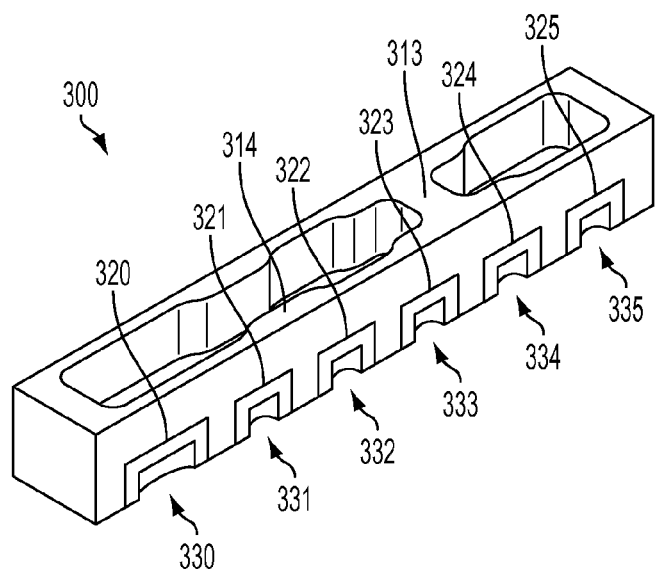
FIG. 3B illustrates a packaged LED device according to another embodiment in which a sidewall of the package has a non-uniform thickness and contains structural strength enhancing regions of increased thickness.

FIG. 3B illustrates an alternative embodiment of the packaged LED device 300 in which the package 307 includes a variable wall thickness and an internal radius to add wall thickness in select areas and thus increase the package structural strength, such as a structural strength enhancing region 314 of increased thickness in a sidewall of the package. FIG. 3B also illustrates castellations 330, 331, 332, 333, 334, 335 and leads 320, 321, 322, 323, 324, 325 having varying dimensions (e.g., at castellation 330 and lead 320 are wider than the other castellations and leads in the device 300).

Figure 4A:
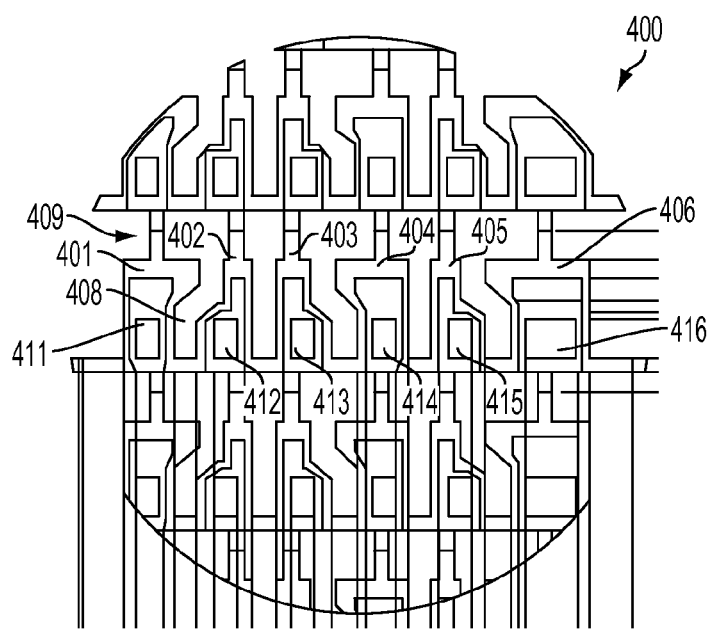
FIG. 4A illustrates a portion of a lead frame according to one embodiment in which the respective leads contain non-uniform recesses for forming castellations having varying widths and sides and ends of the leads are etched to increase a surface area of the leads.

FIG. 4A is a schematic top (overhead) view of a lead frame 400 having a plurality of leads 401, 402, 403, 404, 405, 406 used for producing a packaged LED device, such as device 300. The lead frame 400 may be formed, for example, by patterning (e.g., etching) a copper sheet or plate to form the frame 400 and leads 401, 402, 403, 404, 405, 406 in a desired shape. Pits (i.e., recesses) 411, 412, 413, 414, 415, 416 may be formed in a surface of the leads 401, 402, 403, 404, 405, 406 to provide the recessed portions. The sides 408 and ends 409 of the leads 401, 402, 403, 404, 405, 406 may be etched to increase a surface area for the package material (e.g. epoxy) to mate with and thus improve the adhesion of the leads to the package. The leads may be removed from the frame 400 to produce a packaged LED device, as described further below.

Figure 4B:
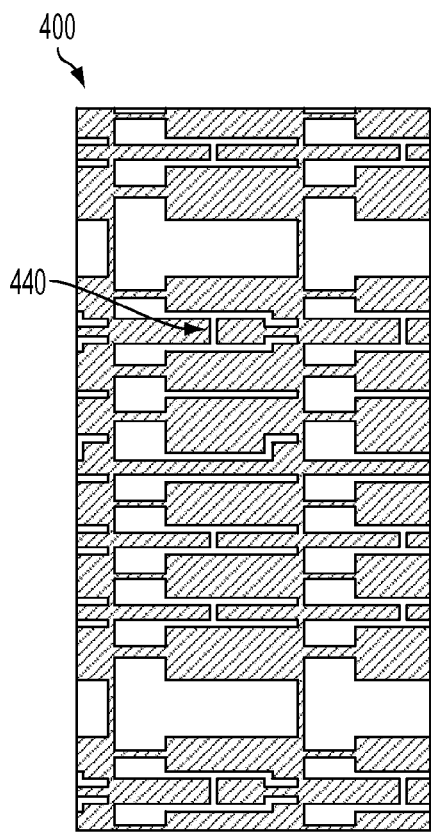
FIG. 4B illustrates a portion of a lead frame that includes floating finger leads which contain at least one free hanging, cantilevered end which is not attached to the frame.

FIG. 4B illustrates an alternative embodiment of a lead frame 400 having one or more "floating finger" leads 440 (i.e. a protrusion or finger that is not supported at both ends. e.g., which contains at least one free hanging, cantilevered end which is not attached to the frame). The floating finger lead frame may be made significantly wider to support it. The floating fingers allow for independent electrical connections inside the package after the leads are singulated (i.e., removed from the frame 400).

Figure 5A:
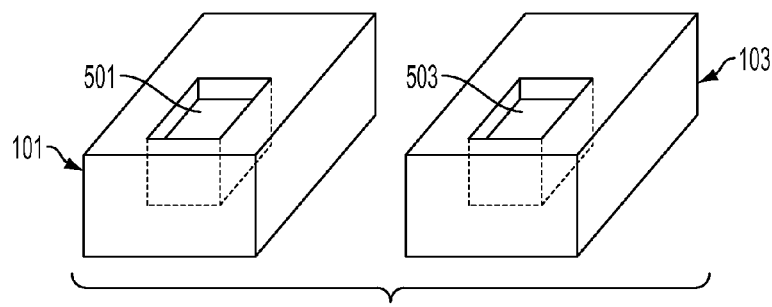
FIGS. 5A-D illustrate a method of packaging an LED die with a plurality of leads and a package according to one embodiment.

FIGS. 5A-D illustrate a method of packaging an LED die according to one embodiment. The method may include forming pits (i.e., recesses) 501, 503 in the back side of the respective leads 101, 103 of a lead frame, as shown in FIG. 5A. The leads frame having leads or "fingers" may be as shown in FIGS. 4A-B, for example. The leads 101, 103 are illustrated as rectangles for simplicity in FIG. 5A-D, although other shapes may be used. In addition, the frame that connects the leads 101, 103 is not illustrated for clarity.

Figure 5B:
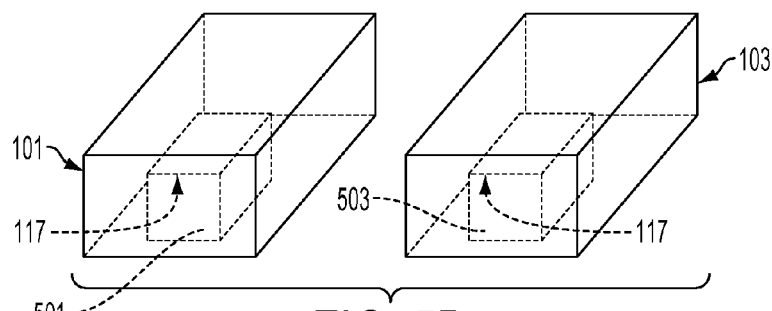
Figure 5C:
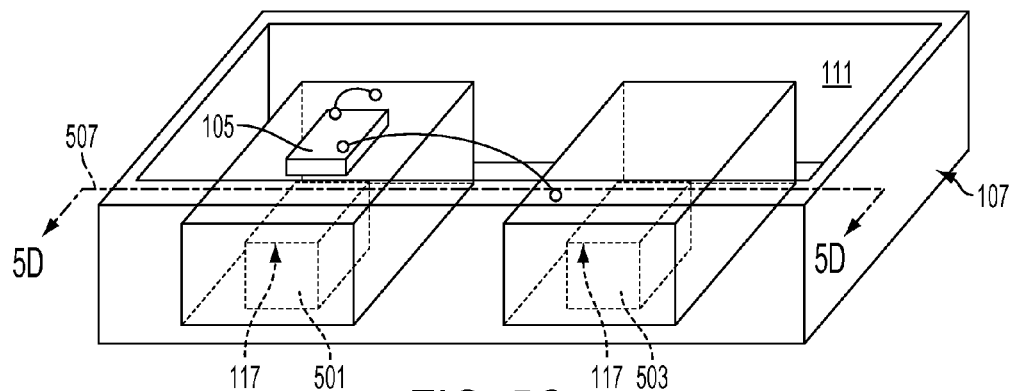
Figure 5D:
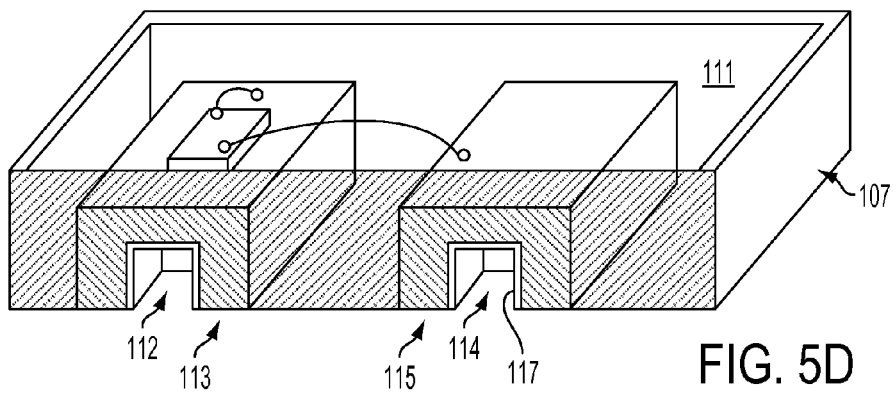

A metal filler 117 (e.g., a solderable metallization stack up) may be formed in the pits 501, 503, as shown in FIG. 5B. An LED die 105 may be bonded to the top surface of one or both leads 101, 103, as shown in FIG. 5C. The LED die 105 may be electrically connected to the leads 101, 103 by wires. The leads 101, 103 and LED die 105 may then be encapsulated by a package 107, which may be an epoxy material. The package 107 includes an opening 111 in its upper surface exposing at least the LED die 105.

Figure 6:
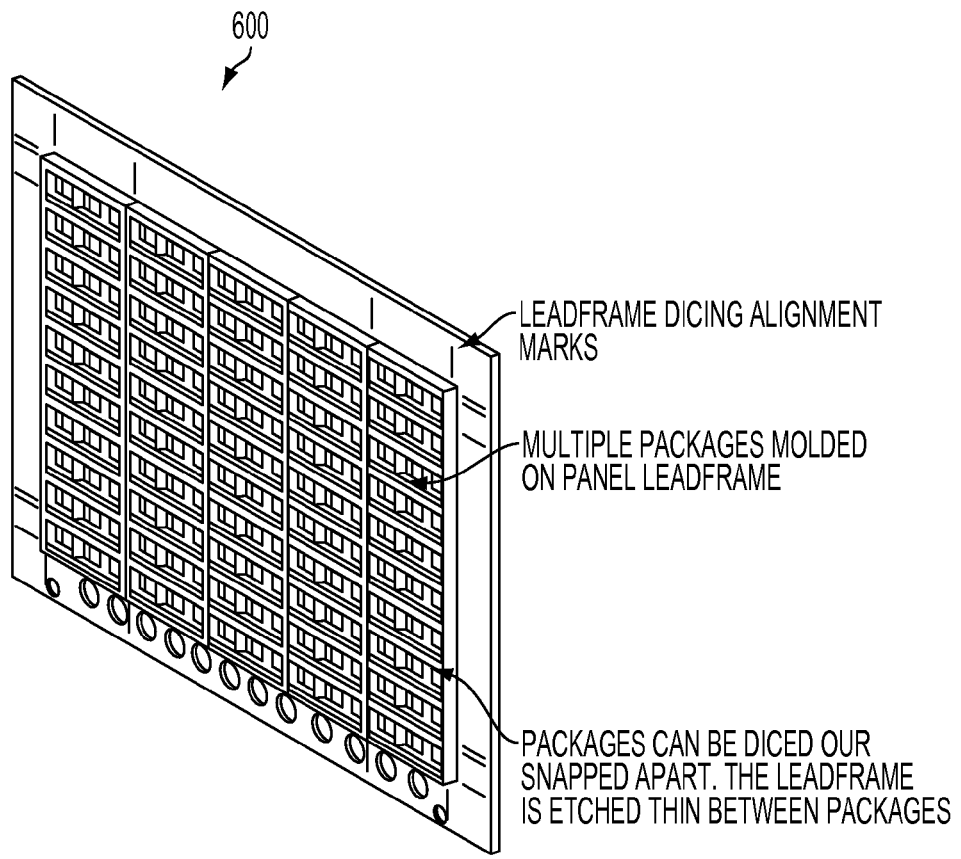
FIG. 6 illustrates a lead frame having a plurality of molded packages attached thereto and having alignment marks to facilitate separation of individual LED packages.

In embodiments, the package 107 may be formed by dipping a lead frame containing the leads 101, 103 and LED die(s) 105 into a mold containing an epoxy and solidifying the epoxy to form the package attached to the lead frame. Alternatively, the die 105 may be attached to the leads 101, 103 after the formation of the package 107 on the leads 101, 103. Thus, the LED die 105 may be electrically connected to the first lead and to the second lead by wire bonding the LED die to the first lead and to the second lead before or after the step of forming the package. A plurality of packages 107, each encapsulating a plurality of lead frame leads and one or more LED dies, may be formed over a lead frame 400 to form a panel 600 of packaged LEDs, as shown in FIG. 6. In embodiments, the molded panel 600 may have alignment marks (e.g., dicing lines) molded into the surface of the epoxy package walls. Similar marks, such as etched lines or slots, may be included in the lead frame 400. These features may facilitate inspection to check that the molded epoxy panel is aligned to the lead frame within specified tolerances. In addition, the alignment marks may aid a dicing operator in aligning a dicing saw blade to the panel and for quality assurance to check after dicing that the diced package walls are within tolerance. Thus, the singulation step may optionally include checking that a first alignment mark on the lead frame and a second alignment mark on the package (or on the panel) are within a predetermined tolerance, and aligning a dicing saw blade with the first alignment mark and the second alignment mark before dicing the package from the lead frame.

FIG. 5C illustrates a dicing line 507 in the epoxy package 107. The dicing line 507 may be aligned over the pits 501, 503 in the respective leads 101, 103 of the lead frame. The package 107 containing the LED die 105, the first lead 101 and the second lead 103 may then be separated from the lead frame, as shown in FIG. 5C. Separating the package 107 from the lead frame may include dicing or snapping the package along the dicing line 507 and through the pits 501, 503 to expose a first castellation 113 and a second castellation 115 in the side surface of the package 107. Dicing or otherwise separating the package 107 through the pits 501, 503 exposes the recessed portions 112, 114 of the leads 101, 103, as well as the filler material (e.g., solderable metal) which partially fills the pits.

Figure 7:
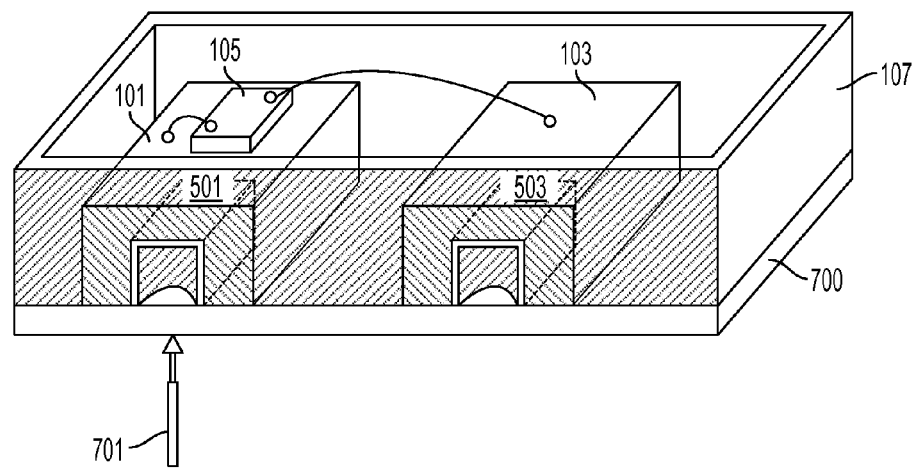
FIG. 7 schematically illustrates a method of testing an LED package using a testing pin according to one embodiment.

In embodiments, a dicing tape 700 may be bonded to the bottom surface of the package 107, prior to separating the package 107 from the lead frame (i.e., singulation), as shown in FIG. 7. The LED die 105 may be tested by poking a testing pin 701 or needle through the dicing tape 700 in the area of the pits 501, 503. The pits 501, 503 allow the tape 700 to stretch and the pin 701 to break through the tape to contact the leads 101, 103. The pin 701 may form a temporary electrical connection with the LED device to enable testing. This action of punching through tape instead of crushing or pinching has the added advantage that the probe tip is wiped clean and thus avoids clogging of the probe needle.

The foregoing method descriptions are provided merely as illustrative examples and are not intended to require or imply that the steps of the various embodiments must be performed in the order presented. As will be appreciated by one of skill in the art the order of steps in the foregoing embodiments may be performed in any order. Words such as "thereafter," "then," "next," etc. are not necessarily intended to limit the order of the steps; these words may be used to guide the reader through the description of the methods. Further, any reference to claim elements in the singular, for example, using the articles "a," "an" or "the" is not to be construed as limiting the element to the singular.

Although the foregoing refers to particular preferred embodiments, it will be understood that the invention is not so limited. It will occur to those of ordinary skill in the art that various modifications may be made to the disclosed embodiments and that such modifications are intended to be within the scope of the invention. All of the publications, patent applications and patents cited herein are incorporated herein by reference in their entirety.

What is claimed is:

1. A method of packaging a light emitting diode (LED), comprising:
   providing a lead frame comprising a first lead having a first recess in a bottom surface and a second lead having a second recess in a bottom surface;
   placing a LED die over a top surface of at least one of the first and the second leads;
   electrically connecting the LED die to the first lead and to the second lead;
   forming a package around the LED die, the first lead and the second lead, the package having an opening in its upper surface exposing at least the LED die; and
   separating the package containing the LED die, the first lead and the second lead from the lead frame such that the package contains a first castellation and a second castellation in a side surface of the package, wherein the step of separating the package from the lead frame comprises dicing or snapping the package from the lead frame to expose the first castellation and the second castellation in the side surface of the package;
   wherein:
   the first castellation exposes at least one of the first lead and a first platable metal which is electrically connected to the first lead; and
   the second castellation exposes at least one of the second lead and a second platable metal which is electrically connected to the second lead, wherein the method further comprising forming the first platable metal in the first recess on the first lead and forming the second platable metal in the second recess on the second lead, wherein the first castellation exposes an edge of the first lead and the first platable metal, and the second castellation exposes an edge of the second lead and the second platable metal.

2. The method of claim 1, wherein:
   the step of forming the package comprises dipping the lead frame into a mold containing an epoxy and solidifying the epoxy to form the package attached to the lead frame; and
   the step of electrically connecting the LED die to the first lead and to the second lead comprises wire bonding the LED die to the first lead and to the second lead before or after the step of forming the package.

3. The method of claim 1, further comprising attaching a bottom surface of the package to dicing tape prior to the step of separating the package from the lead frame.

4. The method of claim 3, wherein the step of separating the package from the lead frame comprises dicing the package from the lead frame along a dicing line which passes through the first recess and the second recess to expose the first castellation and the second castellation in the side surface of the package.

5. The method of claim 1, further comprising: after the step of separating the package, placing the package on a support surface in a side emitting configuration such that the side surface of the package faces the support surface.

6. The method of claim 5, wherein:
   the support surface comprises a first electrical contact and a second electrical contact;
   the first electrical contact electrically contacts the first lead through the first castellation;
   the second electrical contact electrically contacts the second lead through the second castellation;
   the opening in an upper surface of the package is located in a plane perpendicular to the support surface; and
   a light emitting surface of the LED die is positioned in the package to emit light parallel to the support surface.

7. The method of claim 1, further comprising: after the step of separating the package, placing the package on a support surface in a top emitting configuration such that the first and the second leads exposed in the bottom surface of the package contact respective first and second electrical contacts located over the support surface.

8. The method of claim 1, wherein the LED die comprises at least one green emitting LED die.

9. The method of claim 1, wherein placing the LED die over the top surface of at least one of the first and the second leads comprising bonding the LED die to the top surface of at least one of the first and the second leads.

10. The method of claim 1, further comprising etching the lead frame to etch sides and ends of at least the first and the second leads to increase a surface area of the first and the second leads.

* * * * *